United States Patent [19]

Haken

[11] Patent Number: 4,577,390

[45] Date of Patent: Mar. 25, 1986

[54] FABRICATION OF POLYSILICON TO POLYSILICON CAPACITORS WITH A COMPOSITE DIELECTRIC LAYER

[75] Inventor: Roger A. Haken, Richardson, Tex.

[73] Assignee: Texas Instruments Incorporated, Dallas, Tex.

[21] Appl. No.: 468,920

[22] Filed: Feb. 23, 1983

[51] Int. Cl.[4] .......................................... H01L 21/283
[52] U.S. Cl. ....................................... 29/570; 29/571; 29/577 C; 29/578; 148/187
[58] Field of Search .................. 148/187; 29/570, 571, 29/578, 577 C

[56] References Cited

U.S. PATENT DOCUMENTS

| 4,270,262 | 6/1981 | Hori et al. | 29/571 |
| 4,426,764 | 1/1984 | Kosa et al. | 29/571 |
| 4,490,900 | 1/1985 | Chiu | 29/571 |

Primary Examiner—George T. Ozaki
Attorney, Agent, or Firm—Robert Groover; James T. Comfort; Melvin Sharp

[57] ABSTRACT

The present invention teaches a new method for formation of thin dielectrics over polysilicon. This technique permits the fabrication of polysilicon to polysilicon capacitors with high specific capacitance (per unit area). This technique is completely compatible with standard MOS dual polysilicon regrown gate oxide processes. The high value of specific capacitance is achieved by using a composite dielectric which has high dielectric integrity and whose thickness is completely independent of the formation of the regular gate oxide under the second polysilicon layer. No extra mask steps are required. The composite dielectric is formed as a grown or deposited oxide followed by deposited nitride which is then reoxidized. Optionally, a second oxide is deposited before reoxidation forms.

7 Claims, 9 Drawing Figures

Fig. 9

FABRICATION OF POLYSILICON TO POLYSILICON CAPACITORS WITH A COMPOSITE DIELECTRIC LAYER

BACKGROUND AND SUMMARY OF THE INVENTION

The present invention relates to a method for fabricating a thin capacitor dielectric layer over a layer of polysilicon.

One of the key process issues for realizing high performance analog and digital CMOS circuits is the ability to fabricate precision, high value, polysilicon to polysilicon capacitors, at the same time as low resistance poly gates and interconnect.

A common technique for producing precision polysilicon to polysilicon capacitors is to lightly dope the first level of polysilicon (bottom plate) to 100 ohms/sq, so a very uniform dielectric can be grown at the same time the gate oxide is regrown. Second level polysilicon is then used as the top plate.

Incorporating such a technique into a CMOS flow means that the sheet resistance of uncovered first level polysilicon inside the tank is increased to around 200 ohms per square, due to the counterdoping action of the P+ S/D implant. (This could be avoided by including extra mask steps or merging levels). Outside the tank, the first polysilicon sheet resistance is reduced by the N+ S/D implant to 40 ohms per square. For these reasons many process flows have used first polysilicon primarily for the bottom plate of capacitors and low or natural $V_T$ N-channel transistors. Second polysilicon, doped to around 15 ohms per square, can be used for regular gates, interconnect and capacitor top plates. High impedance polysilicon resistors in such a process flow would require an extra mask step.

As the process is scaled, this type of flow becomes more important since a polycide layer for low sheet resistance gates and interconnect is required. This follows since the polycide sheet resistance increases with the number of heat treatment cycles and thermal oxidations that follow its deposition.

The main limitation of this technique is that the capacitor's dielectric thickness, and hence maximum value, is controlled by the regrown gate oxide thickness, used for regular gates (second polysilicon). For a 700 Angstrom gate oxide process this limits the dielectric to about 1100 Angstroms (oxide grows faster on doped polysilicon), resulting in a capacitance of 0.2 pF/mil$^2$. Scaling the process to 3 microns and the gate oxide to 550 Angstroms does significantly increase the maximum capacitance achievable. For some analog bars the low value of capacitance/unit area means that the area occupied by capacitors is comparable to, or greater then, the rest of the circuitry. Any increase in capacitance will be useful in terms of reduced noise, improved power supply rejection and reduced area. These considerations become more important as the technology is scaled.

The present inventions provides a demonstrated technique for fabricating polysilicon to polysilicon capacitors with a much higher capacitance/unit area, 0.8 pF/mil$^2$. The technique utilizes a composite oxide/nitride/oxide dielectric whose thickness can be controlled independently of the regrown gate oxide process, without the requirement of an extra mask. The composite dielectric has very good integrity: typical breakdown for a 350 Angstrom composite layer is 24–30 V. Leakage measurements indicate characteristics similar to poly capacitors with an 800 Angstrom thermally grown oxide. In some of the test experiments the oxide and nitride layers were formed by LPCVD. These have exhibited high uniformity, better than 0.005%/mil or 3% across a 3" slice. A further advantage of using an LPCVD dielectric is that the first polysilicon layer can be doped to about 15 ohms per square since it is no longer necessary to thermally grow a uniform oxide. This gives the designer the flexibility of using both heavily doped first polysilicon and silicided second polysilicon for interconnecting.

A general problem in the development of analog and data conversion integrated circuits is the large area which is frequently required for capacitors. In many applications, it may be found that half of the bar area is taken up with capacitors. This means that the density of capacitors is the limiting factor in achieving further integration of such analog integrated circuits. If a capacitor could be reliably fabricated within the stream of MOS processing with higher specific capacitance, i.e., higher capacitance per unit area, then smaller capacitors could be used, and capacitors would not be such a burden on the density of analog ICs.

Thus it is an object of the present invention to provide a method for fabricating capacitors having high specific capacitance for analog and data conversion integrated circuits.

It is a further object of the present invention to provide a method for fabricating capacitors having high specific capacitance in a standard MOS process.

A further important limitation in many analog and telecom circuits is that the value of the capacitors must be precise, i.e. the specific capacitance of the as-fabricated capacitors should be constant, from lot to lot, to, e.g., three percent.

Thus it is an object of the present invention to provide a method for reproducibly fabricating capacitors having a desired predetermined specific capacitance.

Capacitors in many analog integrated circuit layouts are preferably fabricated between the first and second polysilicon levels, usually over field oxide, to achieve greater integration. Moreover, it is often greatly preferable to form polysilicon to polysilicon capacitors rather than polysilicon-to-silicon substrate capacitors, because a buried N+ or a depletion type implant is required to make contact to the lower plate of the capacitor. Otherwise, the lower plate of the capacitor will, in effect, be the whole substrate, i.e., one side of the capacitor is grounded. Secondly, if a depletion implant is used, so that the carrier concentration at the lower (substrate) plate of the capacitor is not extremely high, the depletion width will be modulated by the voltage on the capacitor top plate, i.e., the capacitor becomes a nonlinear element in which the capacitance is a variable function of voltage. If a heavy N+ doping is required under polysilicon-to-substrate capacitors, this means that additional processing steps are required. However, forming a precision capacitor over a first polysilicon level is particularly difficult, since the surface of the first polysilicon level will never be as smooth as that of a monocrystalline polished semiconductor surface, that is, the surface of even good polysilicon will normally have a certain amount of unevenness. This unevenness can significantly affects the thickness of an oxide which is formed over the polysilicon. It not only leads to uncertainty in the average specific capacitance, but also can cause formation of areas where an oxide grown over polysilicon is locally thin.

Thus, it is a further object of the present invention to provide a method for reliable fabrication of uniform dielectrics over a polysilicon level. The roughness of the polysilicon surface means that pinholing through a dielectric grown over the first polysilicon layer can occur. This problem becomes particularly serious if the dielectric is a thin one, as is required for high specific capacitance. This is a major concern in large analog integrated circuits, since the large total area devoted to capacitors means that even a small density of capacitor pinholes can cause drastic yield degradation.

Thus, it is a further object of the present invention to provide a thin polysilicon to polysilicon dielectric having a very low density of pinholes.

In double polysilicon layer processes, a regrown gate oxide is normally used to form transistors having second polysilicon level gates. That is, after the first polysilicon level has been completely formed, the areas where transistors and the second polysilicon level are to be formed are cleared down to silicon, and the gate oxides for second polysilicon level transistors are grown from scratch. However, the oxidizing conditions which permit growth of the second gate oxide also promote growth of oxide over the first polysilicon level. Moreover, oxide normally grows faster on doped polysilicon than on crystalline silicon under the same conditions, so that a thicker oxide will be formed over the first polysilicon level. Where the oxide has already been formed over the first polysilicon level before growth of the second gate oxide, as is typical, the oxide thickness over the first polysilicon level will be increased by the oxidizing conditions.

The second gate oxide will, of course, normally be grown to a precisely controlled thickness, but the simultaneous thickness increase of the oxide over the first polysilicon level will be uncontrolled. The chief reason for this is because of doping uncertainty. The oxidizing rate is a function of the polysilicon doping level, and the doping level itself cannot be precisely controlled in highly conductive $POCl_3$-doped polysilicon. Even if the polysilicon doping is performed by ion implantation, the average doping level in polysilicon will still be sensitive to the thickness of the polysilicon level deposited, which is also normally not a parameter which can be precisely controlled.

Thus it is an object of the present invention to provide a method for growth of a second gate oxide without any uncontrolled change in the thickness of an existing oxide over a first polysilicon level.

Thus it is an object of the present invention to provide a method for growth of a second gate oxide without simultaneously growing a thick oxide over the first polysilicon level.

It is a further object of the present invention to provide a method for growing a second gate oxide without increasing the thickness of a dielectric over a first polysilicon level.

A further problem with formation of capacitors is uniformity of the specific capacitance across the wafer. This problem is most acute in data conversion circuits where nonuniformity of capacitors can sacrifice several bits of accuracy. If integrated data conversion circuits are to have performance competitive with custom-trimmed hybrid circuits, uniform specific capacitance is a must. This is also a problem with switched-capacitor filtering, where nonuniformity can substantially degrade filter characteristics.

Thus it is a further object of the present invention to provide a method for forming polysilicon to polysilicon capacitors with highly uniform specific capacitance across the wafer.

In the present invention a composite oxide/nitride/oxide dielectric is used over the first polysilicon level instead of the thermal oxide taught by the prior art. This means that very thin dielectrics can be used over the first polysilicon level which have very high dielectric integrity (low level of pinholes) and very high dielectric strength (breakdown voltage). Moreover, the dielectrics formed by the present invention are virtually unaffected by the normal second gate oxide growth cycle, so that the problem of uncontrolled thickness increase vanishes.

The problems described above are exacerbated in high voltage circuits, particularly in high voltage telecommunications circuits. Since the oxide thickness must be extremely high in these circuits anyway to prevent gate/drain breakdown and excessive injection of hot carriers into the gate oxide, the problem of thickening of the oxide over the first polysilicon level during the growth of the second polysilicon level is exacerbated. That is, a typical thickness for the second gate oxide in a high voltage CMOS process would be 600 Angstroms, and while 600 Angstroms of oxide are grown on silicon, typically 1000 Angstroms will be grown on doped polysilicon, or the thickness of an existing oxide layer on polysilicon would be increased.

The present invention advantageously provides a method for fabricating capacitors having high specific capacitance for analog and data conversion integrated circuits.

The present invention advantageously provides a method for fabricating capacitors having high specific capacitance in a standard MOS process.

The present invention advantageously provides a method for reproducibly fabricating capacitors having a desired predetermined specific capacitance.

The present invention advantageously provides a method for reliable fabrication of uniform dielectrics over a uniform polysilicon level.

The present invention advantageously provides a thin polysilicon-to-polysilicon dielectric having a very low density of pinholes.

The present invention advantageously provides a method for growth of a second gate oxide without simultaneously growing a thick oxide over a first polysilicon level.

The present invention advantageously provides a method for growing a second gate oxide without increasing the thickness of a dielectric over a first polysilicon level.

The present invention advantageously provides a method for forming polysilicon-to-polysilicon capacitors with highly uniform specific capacitance across the wafer.

The present invention advantageously provides a method for fabricating high voltage MOS integrated circuits, in which the thickness of the dielectric between the first and second polysilicon levels can be selected to be equal to or less than the thickness of the second gate oxide.

It is a further object of the present invention to provide a method for fabricating high voltage MOS integrated circuits, in which the thickness of the dielectric between the first and second polysilicon levels can be selected to be equal to or less than the thickness of the second gate oxide.

According to the present invention, there is provided:

An integrated circuit structure comprising:
a substrate;
a first polysilicon layer overlying portions of said substrate;
a dielectric layer on said first polysilicon layer; and
a second polysilicon layer on said dielectric;
wherein said dielectric comprises a silicon dioxide/silicon nitride/silicon dioxide composite.

According to the present invention there is provided:

A method for fabricating a dielectric over a first conductive layer in an integrated circuit fabrication, comprising the steps of:
providing a substrate;
providing a first conductive layer over said substrate, said first conductive layer being polycrystalline and comprising silicon;
forming a silicon dioxide layer over said first conductive layer;
forming a silicon nitride layer over said silicon dioxide layer;
clearing areas of said silicon substrate where a second plurality of transistors are to be formed;
oxidizing said cleared areas of said silicon to form a plurality of second gate oxides, and simultaneously partially oxidizing said nitride layer, whereby a composite oxide/nitride/oxide dielectric is provided over said first conductive layer; and
depositing a second conductive layer selectively over said locations of said second plurality of transistors and over portions of said first conductive layer.

BRIEF DESCRIPTION OF THE DRAWING

The present invention will be described with reference to the accompanying drawings, wherein.

DESCRIPTION OF THE PREFERRED EMBODIMENTS

FIGS. 1-9 show how the present invention is applied on the context of a high voltage double polysilicon level CMOS process. The key process steps which permit realization of the thin dielectric according to the present invention are as follows:

After the first gate oxide 12 has been grown, the first level 14 of polysilicon is deposited and doped with a phosphorus implant of, e.g., $5 \times 10^{15}$ per square centimeter.

A thin layer 16 of low pressure CVD silicon dioxide is now deposited (or alternatively thermally grown) to a thickness of 200 Angstroms. Next, about 200 Angstroms of low pressure CVD silicon nitride 18 is deposited, which leads to the structure shown in FIG. 4.

The prior art has frequently used similarly grown oxides over first polysilicon levels. However, the difficulty in this case is that, if a good thermal oxide is to be grown over a first polysilicon level, the first polysilicon level must have a relatively low doping. That is, the conductivity of the first polysilicon level in this case cannot be made much less than about 100 ohms per square, which means that the first polysilicon level is useless for interconnects. However, if a deposited oxide is used over the first polysilicon level, the first polysilicon level can be highly doped. The chief question would appear to be whether the deposited oxide can be deposited with sufficient uniformity. This has been found to be the case.

As discussed above, it may be preferable to use a deposited rather than a grown first oxide layer for the polysilicon to polysilicon dielectric. In one embodiment of the present invention, this is accomplished by a single-reactor multi-dielectric deposition process. The preferred embodiment of this process will now be described in detail.

Preferably a tube reactor is used to deposit low pressure CVD films of nitride and oxide, and optionally also to deposit polysilicon and to perform oxidation. The key feature is that the reactor is kept at the same temperature during all of the various deposition phases applied. *This is critical.* The available precision of furnace control will naturally impose limits on the exact constancy of temperature which can be achieved, but it is preferable that the amount of thermal cycling of the deposition furnace be kept to an absolute minimum. Thermal cycling will tend to release particulates, which is a crucial hazard in any chemical deposition process. In particular, the release of particulates is a particular hazard where nitride is being deposited.

All depositions are LPCVD processes. The preferred oxide deposition is not a standard process, since the process parameters have been adjusted so that oxide deposition can be performed at the same temperature (800° C. in this embodiment) as the other deposition and oxidizing steps. For oxide deposition, the flow rate used in the presently preferred embodiment is 30 sccm of dichlorosilane and 150 sccm of nitrous oxide, at a total pressure of 500 millitorr. The total pressure can be regulated, for example, by a pump purge of pure nitrogen, which is throttled to keep the tube pressure up to the desired level.

The preferred nitride deposition parameters use the standard Thermco process. That is, 30 sccm of dichlorosilane and 90 sccm of ammonia are flowed at a total pressure of 130 millitorr. Again, the temperature is 800° C.

To perform oxidation, a pure oxygen atmosphere is used, again at the same temperature as the other processing steps in the same reactor (800° C.). At present, due to pump constraints, it is preferred that the oxygen pressure be kept below 150 torr, but this is not a strictly necessary limitation.

Polysilicon can also be grown in the same reactor without removing the slice from the reactor. The preferred process parameters for polysilicon deposition are 30 sccm of dichlorosilane at a total pressure of 170 millitorr at 800° C. (In the present mode of operation, a nitrogen purge is varied to adjust the pressure as desired.)

Thus, any of these four process steps can be applied in any sequential combination, without removing the slice from the reactor. This provides major advantages in VLSI processing, of several kinds. First, in any deposition reactor, every load operation imposes a risk of particulates being dislodged from the carrier or furnace lock. Secondly, every time a slice is exposed to the air, even in a clean room, a substantial risk of particulate matter suffering electrostatic binding to the slice, and particularly to insulating areas on the slice, is incurred. Third, handling damage risks are of course reduced when no handling is used between furnace steps.

As is well known in the art of furnace deposition, it is normally necessary to clean deposited matter off the furnace walls periodically, e.g., by wet etching.

The furnace used is preferably a hot wall furnace, i.e., a tube which is heated by resistance heaters outside of the tube. However, a susceptor-heated furnace or other furnace could alternatively be used. Thus, the present invention can be practiced (although this is not the most preferred embodiment) by, after the first polysilicon level is in place and patterned, applying an oxide layer, applying a nitride layer, applying an oxidizing ambient to partially reoxidize the nitride layer, and then applying a second polysilicon layer. All of these steps could be performed sequentially without removing the slice from the reactor or maneuvering it at all. It is only after the second polysilicon layer has been deposited that the slice must be removed for doping and etching of the second polysilicon layer.

In an alternative embodiment of the invention, a three layer dielectric stack is applied prior to the reoxidation step. That is, an oxide layer is deposited (or grown), a nitride layer is deposited on the oxide layer, and then another oxide layer is deposited on the nitride layer prior to the oxidizing step which forms the second gate oxide. Slight additional oxidation of the nitride may take place during the gate oxide regrowth step, but this depends on the thickness of the top oxide. In one embodiment of the invention, a 100 Angstrom layer of oxide is deposited, followed by a 200 Angstrom layer of nitride, followed by a 100 Angstrom layer of oxide. In this case, significant oxidation of the nitride will typically take place when the second gate oxide is grown (e.g., 20–40 Angstroms of the nitride will be oxidized). This embodiment provides even further resistance to dielectric thickness increase and even better integrity, but at the cost of greater process complexity.

The first level 14 of polysilicon and the overlying dielectric 16, 18 are now patterned, to define the bottom plate of capacitors. The gate oxides for transistors with second level polysilicon gates will be formed later. The first gate oxide 12 under the first polysilicon level 14 is also etched, at this time, together with the first polysilicon 14. This results in the structure shown in FIG. 5.

The second gate oxide 20 is then grown to a thickness of, e.g., 200 Angstroms, which at the same time partially oxidizes the 200 Angstrom silicon nitride layer 18. However, the nitride oxidation is a self-limiting process, and only about 40 Angstroms of oxide 19 forms on top of the nitride layer 18. This tends to plug up any pinholes in the thin nitride layer 18.

It is important to note that the second gate oxidation conditions are relatively unimportant to the dielectric stack. That is, the dielectric stack thickness and the second gate oxide thickness are completely independent parameters and can therefore be separately controlled (in processing) and separately optimized (in design).

The layer of oxide 19 is not only quite thin, but is also not truly separated from the nitride layer 18. That is, a region of graded oxide/nitride composition will exist instead of a sharp boundary, and for this reason the oxide layer 19 is not shown separately in FIGS. 6–9. That is, it is more correct to refer to a composite layer 21 than to separate layers 19 and 18.

This is a major source of the advantage of the present invention, in that, not only are the nitride pinholes out of alignment with the underlying oxide pinholes, but also the nitride pinholes themselves tend to be plugged by the reoxidation step.

After performing any transistor threshold adjustments, the second level polysilicon 22 is deposited and doped with phosphorus oxychloride. The second level polysilicon 22 is then patterned and etched. Any exposed nitride 18 is also etched at this step, and this results in the structure of FIG. 6.

Figure 1:
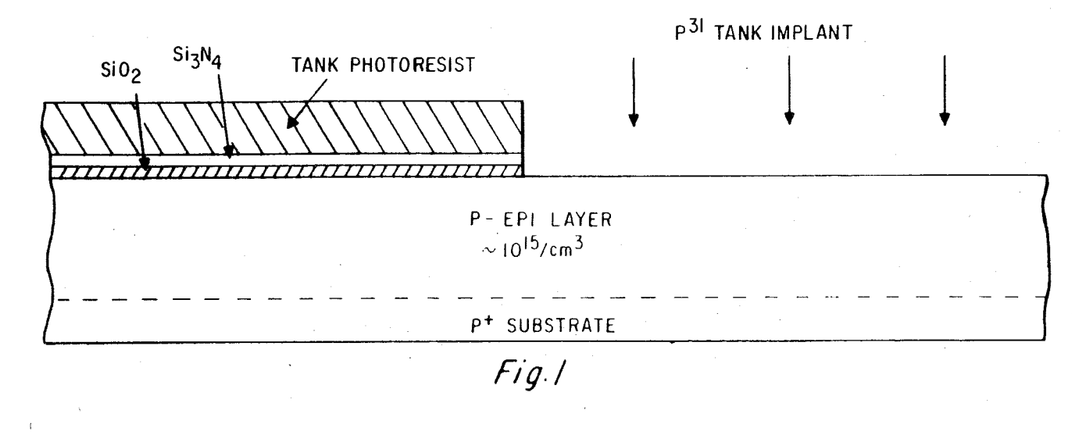
FIGS. 1-9 show a process sequence for forming precision polysilicon to polysilicon capacitors according to the present invention in a high voltage CMOS process.
Figure 2:
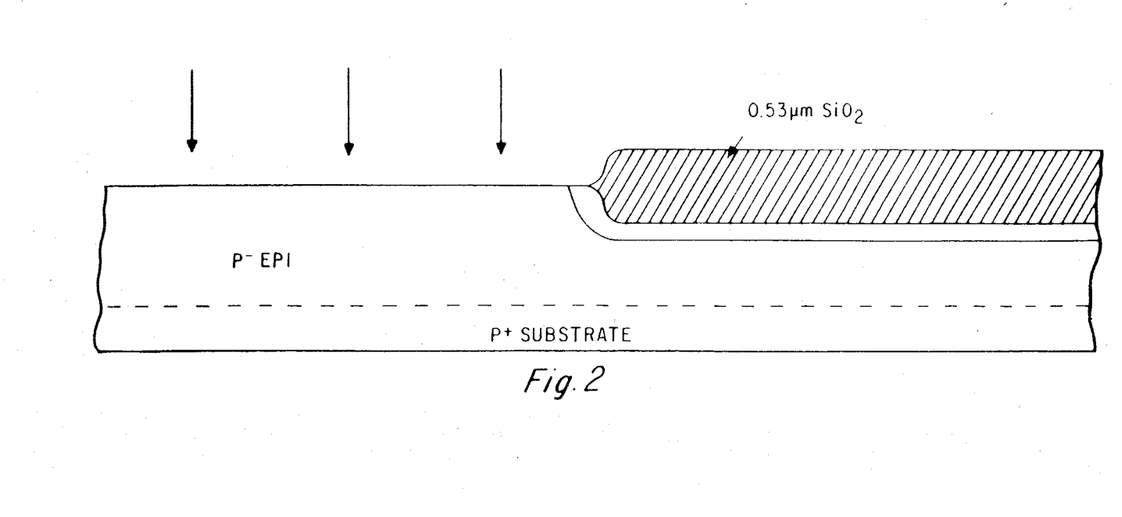
Figure 3:
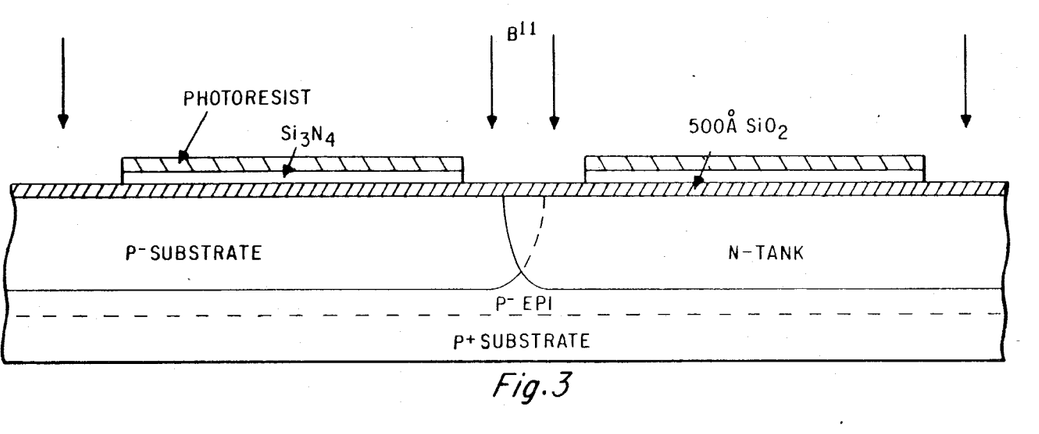
Figure 4:
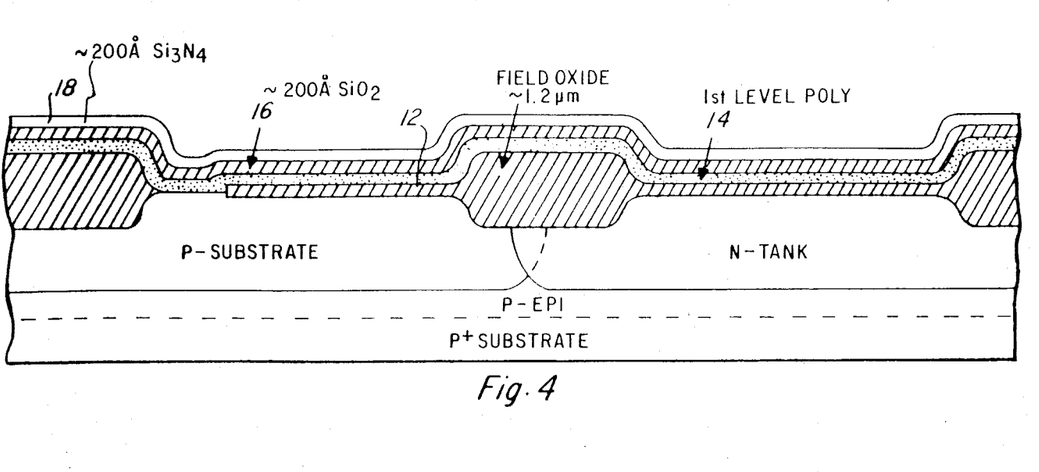
Figure 5:
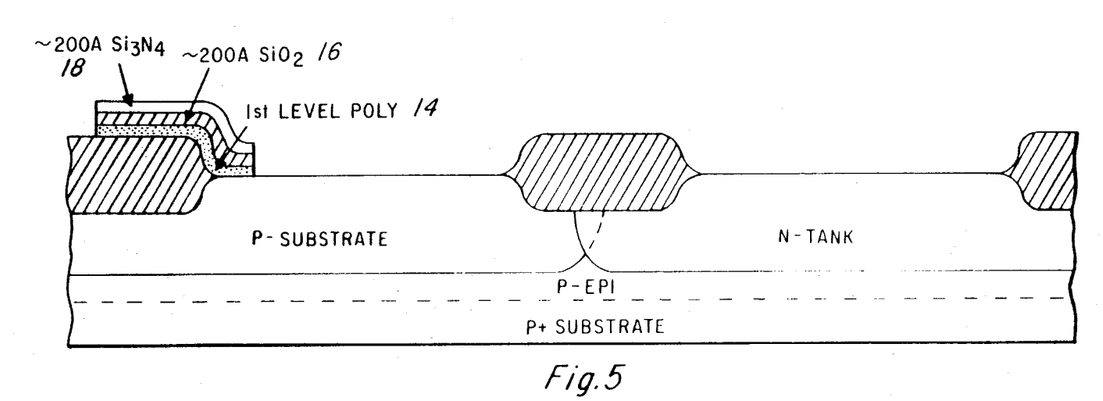
Figure 6:
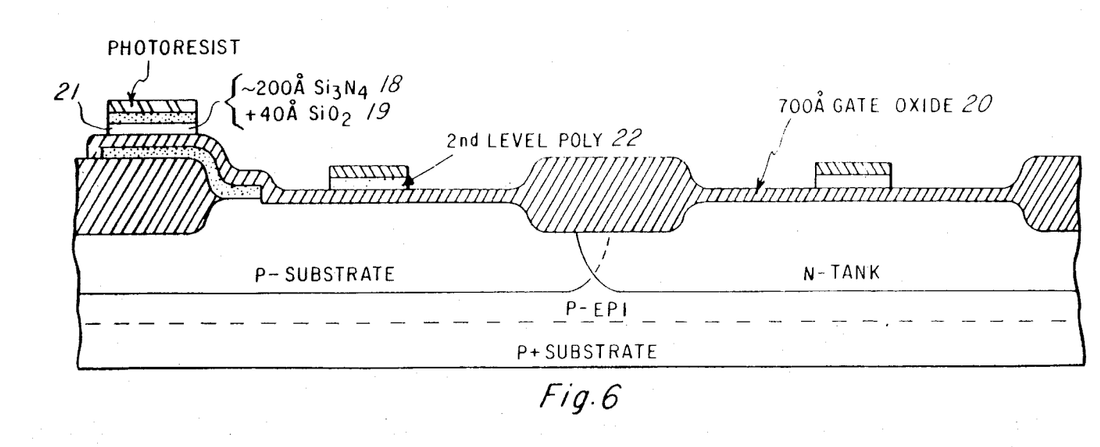
Figure 7:
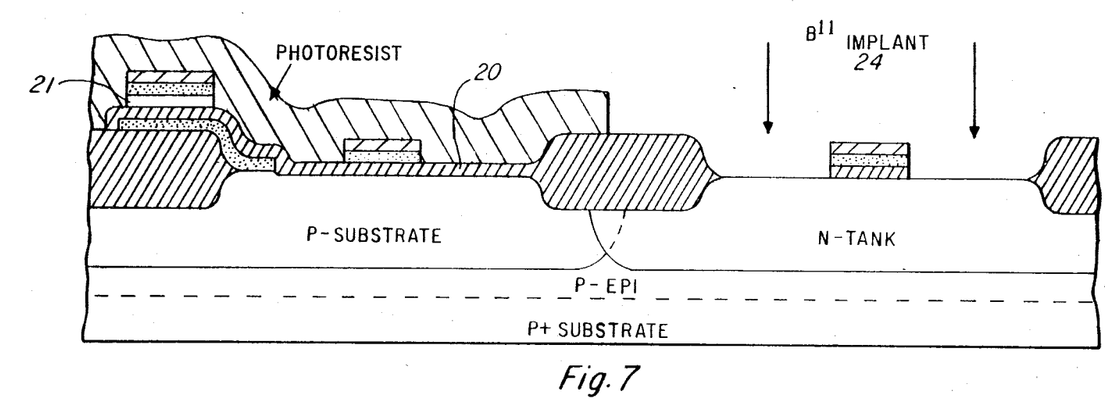

The P+ source/drain implants 24 are then performed, as shown in FIG. 7.

Figure 8:
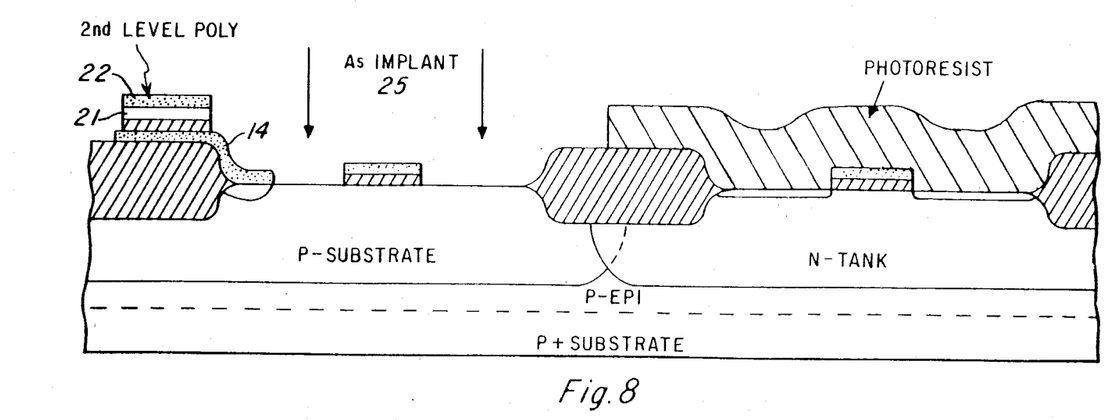

Next the N+ source/drain regions 26 are patterned and the exposed gate oxide 20 is stripped. This removes oxide from on top of the second level polysilicon, the exposed first level polysilicon, and exposed portions of the silicon substrate. This is shown in FIG. 8. Note that the heavy N+ source/drain implant 25 dopes up the exposed first level polysilicon 14 outside of the n-tank region, so that first level polysilicon 14 can also be used for interconnect and for such other uses as N-channel depletion transistors or natural $V_t$ transistors.

Figure 9:
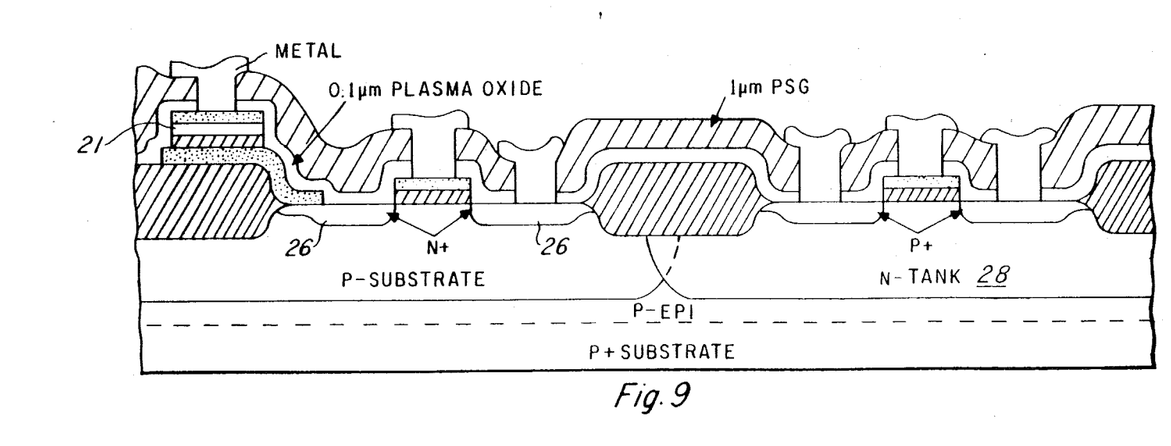

FIG. 9 shows a completed integrated circuit according to the present invention with appropriate contacts to the semiconductor substrate.

Because silicon nitride has a higher dielectric constant than silicon dioxide (approximately 7 vs. 4), a layer of silicon nitride is electrically equivalent to a thinner layer of silicon dioxide. For example, in the presently preferred embodiment, a 200 Angstrom layer of silicon nitride has the same approximate electrical thickness as 120 Angstroms of silicon dioxide, so that the total equivalent thickness of the dielectric layer formed is equivalent to about 350 Angstroms of silicon dioxide. This permits the formation of polysilicon capacitors with a specific capacitance in the neighborhood of 0.8 picofarads per square mil.

It should be noted that the uniformity of specific capacitance across the wafer is strongly dependent on the uniformity of the silicon nitride layer. However, low pressure chemical vapor deposition has been found to give excellent uniformity for nitride layers as thin as 100 Angstroms.

As noted above, the present invention is not by any means limited to application in high voltage processes, but is also useful for analog ICs operating at lower voltages, for conventional DRAM cells, and for any other application whatsoever where formation of a polysilicon to polysilicon capacitor is necessary. That is, according to the present invention, after a first polysilicon layer has been provided: a thin oxide layer is grown or deposited over the first polysilicon layer; a thin nitride layer is also formed over the first polysilicon layer; and the grown nitride layer is partially reoxidized. Preferably, the nitride is partially reoxidized simultaneously with the formation of a second gate oxide. Optionally, an upper oxide is deposited over the nitride before the reoxidation step. This sequence of steps can be inserted in a very wide variety of integrated circuit processes, including not only MOS but also bipolar integrated circuit processes.

Moreover, it should be noted that, although formation of capacitors between two polysilicon levels has been primarily referred to, this is not strictly necessary. For example, the dielectric according to the present invention can easily be formed between a first polysilicon layer and a polycide (i.e., polysilicon/silicide composite), pure silicide, or metal top layer.

Moreover, it is also possible to form a thin uniform capacitor dielectric according to the present invention over a polycide or pure silicide first layer, although this is not the preferred embodiment of the invention. In this case, the oxide and nitride dielectric layers would both preferably be deposited. With silicide or polycide, as with polysilicon, the surface of the silicide layer will normally be uneven. Thus, the same difficulties caused by physical excursion exists with silicide or polycide as exists with polysilicon. Moreover, in silicide and polycide, as in polysilicon, a significant fraction of dopant impurities will normally be included in the material, and these impurities which are uncontrolled will also affect the oxidation rate of the first plate material in an uncontrolled manner. Most silicides are susceptible to partial oxidation (nuisance oxidation) during the oxidizing condition which is used to form the second gate oxide, and therefore the present invention is useful to avoid growth of an uncontrolled thickness of silicon and metal oxides over a silicide bottom layer.

As will be obvious to those skilled in the art, the present invention provides a process innovation having very wide applicability, and can be practiced in the context of a very wide variety of integrated circuit processes, and with a very wide variety of modifications and variations. The scope of the claimed invention is therefore not limited except as specified in the accompanying claims.

What is claimed is:

1. A method for fabricating a composite dielectric layer over a first conductive layer in an integrated circuit fabrication, comprising the steps of:
    providing a substrate;
    providing a first conductive layer over said substrate, said first conductive layer being polycrystalline and comprising doped silicon;
    forming a silicon dioxide layer over said first conductive layer;
    forming a silicon nitride layer over said silicon dioxide layer;
    forming a bottom capacitor plate by selectively clearing areas of said silicon substrate where a plurality of transistors are to be formed;
    oxidizing said cleared areas of said silicon to form a plurality of gate oxides, and simultaneously partially oxidizing said nitride layer, whereby a composite oxide/nitride/oxide dielectric is provided over said first conductive layer; and
    depositing a second conductive layer selectively over said locations of said plurality of transistors and over portions of said first conductive layer.

2. The process of claim 1, wherein said formation of said first oxide over said first conductive layer comprises growth of said oxide by oxidation of said polysilicon.

3. The process of claim 2, wherein said second conductive layer comprises doped polysilicon.

4. The process of claim 1, wherein said second conductive layer comprises doped polysilicon.

5. The process of claim 1, wherein said dielectric is formed with thickness which is preselected independently of the thickness to which said gate oxides are grown, whereby sad dielectric retains approximately said preselected thickness.

6. The process of claim 1, wherein said oxide formation and said nitride formation steps are performed as a single furnace operation in a furnace of a constant temperature without removing said substrate from said furnace.

7. The process of claim 1, wherein said oxide and nitride formation steps and said oxidation steps are performed in a single furnace operation in a furnace held at a constant temperature without removing said substrate from said furnace.

* * * * *